United States Patent
Shim et al.

(10) Patent No.: US 6,414,396 B1
(45) Date of Patent: Jul. 2, 2002

(54) PACKAGE FOR STACKED INTEGRATED CIRCUITS

(75) Inventors: Il Kwon Shim, Singapore (SG); Vincent DiCaprio, Mesa; Paul Hoffman, Chandler, both of AZ (US); Byung Joon Han, Singapore (SG)

(73) Assignees: Amkor Technology, Inc., Chandler, AZ (US); Anam Semiconductor Inc., Seoul (KR)

( * ) Notice: Subject to any disclaimer, the term of this patent is extended or adjusted under 35 U.S.C. 154(b) by 0 days.

(21) Appl. No.: 09/490,317

(22) Filed: Jan. 24, 2000

(Under 37 CFR 1.47)

(51) Int. Cl.[7] ............................................. H01L 29/40
(52) U.S. Cl. ..................... 257/778; 257/686; 257/737
(58) Field of Search ................................ 257/778, 737, 257/738, 685, 686

(56) References Cited

U.S. PATENT DOCUMENTS

| | | | |
|---|---|---|---|
| 3,851,221 A | 11/1974 | Beaulieu et al. | 317/100 |
| 4,567,643 A | 2/1986 | Droguet et al. | 29/575 |
| 4,730,232 A | 3/1988 | Lindberg | 361/381 |
| 4,763,188 A | 8/1988 | Johnson | 357/74 |
| 4,883,773 A | 11/1989 | Ishikura | 438/3 |
| 4,982,265 A | 1/1991 | Watanabe et al. | 357/75 |
| 4,996,587 A | 2/1991 | Hinrichsmeyer et al. | 357/74 |
| 5,012,323 A | 4/1991 | Farnworth | 357/75 |
| 5,025,306 A | 6/1991 | Johnson et al. | 357/75 |
| 5,040,052 A | 8/1991 | McDavid | 357/80 |
| 5,104,820 A | 4/1992 | Go et al. | 437/51 |
| 5,117,282 A | 5/1992 | Salatino | 357/81 |
| 5,138,438 A | 8/1992 | Masayuki et al. | 357/75 |
| 5,140,404 A | 8/1992 | Fogal et al. | 357/70 |
| 5,148,265 A | 9/1992 | Khandros et al. | 357/80 |

(List continued on next page.)

FOREIGN PATENT DOCUMENTS

| | | | |
|---|---|---|---|
| EP | 0 199 635 A2 | 10/1986 | |
| EP | 0 220 460 A2 | 5/1987 | |
| EP | 0 220 460 B1 | 5/1987 | |
| EP | 503 201 A2 | 12/1991 | H01L/23/495 |

(List continued on next page.)

*Primary Examiner*—Roy Potter
(74) *Attorney, Agent, or Firm*—Skjerven Morrill LLP; James E. Parsons (57) ABSTRACT

Embodiments of integrated circuit packages for housing a plurality of integrated circuits are disclosed, along with methods of making the packages. One integrated circuit package comprises a substrate having a first surface having first metallizations thereon, an opposite second surface, and a plurality of apertures between the first and second surfaces. A first integrated circuit having a first surface with first bond pads thereon and an opposite second surface is mounted on the second surface of the substrate so that the first bond pads are superimposed with an aperture. Each first bond pad is electrically connected by a first bond wire extending through the superimposing aperture to a first metallization. A second integrated circuit having a first surface with conductive second bond pads thereon is mounted on the second surface of the first integrated circuit. In particular, the first surface of the second integrated circuit is placed on the second surface of the first integrated circuit so that the second bond pads are superimposed with one or more of the apertures through the substrate. Each second bond pad is electrically connected by a second bond wire extending through the superimposing aperture to a first metallization.

23 Claims, 7 Drawing Sheets

U.S. PATENT DOCUMENTS

| | | | | |
|---|---|---|---|---|
| 5,162,260 A | | 11/1992 | Leibovitz et al. | 437/195 |
| 5,165,067 A | | 11/1992 | Wakefield et al. | 257/783 |
| 5,198,888 A | | 3/1993 | Sugano et al. | 257/686 |
| 5,229,647 A | | 7/1993 | Gnadinger | 257/785 |
| 5,258,330 A | | 11/1993 | Khandros et al. | 437/209 |
| 5,291,061 A | | 3/1994 | Ball | 257/686 |
| 5,323,060 A | | 6/1994 | Fogal et al. | 257/777 |
| 5,334,875 A | | 8/1994 | Sugano et al. | 257/686 |
| 5,343,366 A | | 8/1994 | Cipolla et al. | 361/785 |
| 5,347,429 A | | 9/1994 | Kohno et al. | 361/813 |
| 5,384,689 A | | 1/1995 | Shen | 361/761 |
| 5,422,435 A | * | 6/1995 | Takiar et al. | 174/52.4 |
| 5,426,072 A | | 6/1995 | Finnila | 437/208 |
| 5,426,563 A | | 6/1995 | Moresco et al. | 361/689 |
| 5,432,318 A | | 7/1995 | Minahan | 219/385 |
| 5,432,729 A | | 7/1995 | Carson et al. | 365/63 |
| 5,455,740 A | | 10/1995 | Burns | 361/735 |
| 5,463,253 A | | 10/1995 | Waki et al. | 257/724 |
| 5,473,196 A | | 12/1995 | De Givry | 257/786 |
| 5,477,611 A | | 12/1995 | Sweis et al. | 29/840 |
| 5,479,318 A | | 12/1995 | Burns | 361/735 |
| 5,481,134 A | | 1/1996 | Sobhani et al. | 257/686 |
| 5,493,476 A | | 2/1996 | Burns | 361/735 |
| 5,495,394 A | | 2/1996 | Kornfeld et al. | 361/764 |
| 5,495,398 A | | 2/1996 | Takiar et al. | 361/790 |
| 5,502,289 A | | 3/1996 | Takiar et al. | 174/266 |
| 5,514,907 A | | 5/1996 | Moshayedi | 257/723 |
| 5,519,936 A | | 5/1996 | Andros et al. | 29/840 |
| 5,533,256 A | | 7/1996 | Call et al. | 29/840 |
| 5,536,909 A | | 7/1996 | DiStefano et al. | 174/261 |
| 5,541,812 A | | 7/1996 | Burns | 361/735 |
| 5,552,963 A | | 9/1996 | Burns | 361/735 |
| 5,569,625 A | | 10/1996 | Yoneda et al. | 29/827 |
| 5,581,498 A | | 12/1996 | Ludwig et al. | 365/63 |
| 5,586,009 A | | 12/1996 | Burns | 361/735 |
| 5,587,341 A | | 12/1996 | Masayuki et al. | 437/206 |
| 5,605,592 A | | 2/1997 | Burns | 156/182 |
| 5,608,262 A | * | 3/1997 | Degani et al. | 257/723 |
| 5,614,766 A | | 3/1997 | Takasu et al. | 257/777 |
| 5,633,785 A | | 5/1997 | Parker et al. | 361/766 |
| 5,637,536 A | | 6/1997 | Val | 438/686 |
| 5,637,912 A | | 6/1997 | Cockerill et al. | 257/620 |
| 5,650,593 A | | 7/1997 | McMillan et al. | 174/52.4 |
| 5,654,220 A | | 8/1997 | Leedy | 438/25 |
| 5,682,062 A | | 10/1997 | Gaul | 257/686 |
| 5,684,330 A | | 11/1997 | Lee | 257/692 |
| 5,689,135 A | | 11/1997 | Ball | 257/676 |
| 5,696,031 A | | 12/1997 | Wark | 437/209 |
| 5,715,147 A | | 2/1998 | Nagano | 361/813 |
| 5,716,221 A | | 2/1998 | Kantner | 439/64 |
| 5,721,452 A | | 2/1998 | Fogal et al. | 257/685 |
| 5,739,581 A | | 4/1998 | Chillara et al. | 257/668 |
| 5,744,284 A | | 4/1998 | Laub et al. | 430/313 |
| 5,753,974 A | | 5/1998 | Masukawa | 257/737 |
| 5,766,987 A | | 6/1998 | Mitchell et al. | 438/126 |
| 5,777,391 A | * | 7/1998 | Nakamura et al. | 257/778 |
| 5,783,870 A | | 7/1998 | Mostafazedeh et al. | 257/791 |
| 5,793,108 A | | 8/1998 | Nakanishi et al. | 257/723 |
| 5,798,014 A | | 8/1998 | Weber | 156/263 |
| 5,815,372 A | | 9/1998 | Gallas | 361/760 |
| 5,824,177 A | | 10/1998 | Yoshihara et al. | 156/250 |
| 5,847,932 A | | 12/1998 | Kantner | 361/737 |
| 5,858,815 A | | 1/1999 | Heo et al. | 438/112 |
| 5,861,666 A | | 1/1999 | Bellaar | 257/686 |
| 5,863,813 A | | 1/1999 | Dando | 438/114 |
| 5,866,949 A | | 2/1999 | Schueller | 257/778 |
| 5,872,025 A | | 2/1999 | Cronin et al. | 438/109 |
| 5,885,849 A | | 3/1999 | DiStefano et al. | 438/108 |
| 5,886,412 A | | 3/1999 | Fogal et al. | 257/777 |
| 5,917,242 A | | 6/1999 | Ball | 257/737 |
| 5,950,070 A | | 9/1999 | Razon et al. | 438/113 |
| 5,952,611 A | | 9/1999 | Eng et al. | 174/52.4 |
| 5,973,403 A | | 10/1999 | Wark | 257/777 |
| 5,989,982 A | | 11/1999 | Yoshikazu | 438/462 |
| 6,005,778 A | | 12/1999 | Spielberger et al. | 361/770 |
| 6,025,251 A | | 2/2000 | Jakowetz et al. | 438/464 |
| 6,028,354 A | | 2/2000 | Hoffman | 257/706 |
| RE36,613 E | | 3/2000 | Ball | 257/777 |
| 6,043,109 A | | 3/2000 | Yang et al. | 438/113 |
| 6,051,886 A | | 4/2000 | Fogal et al. | 257/777 |
| 6,057,598 A | | 5/2000 | Payne et al. | 257/723 |
| 6,072,154 A | | 6/2000 | Maynard | 219/209 |
| 6,072,243 A | | 6/2000 | Nakanishi | 257/783 |
| 6,080,264 A | | 6/2000 | Ball | 156/292 |
| 6,184,463 B1 | | 2/2001 | Panchou et al. | 174/52.4 |
| 6,204,091 B1 | | 3/2001 | Smith et al. | 438/108 |
| 6,214,641 B1 | | 4/2001 | Akram | 438/107 |
| 6,235,554 B1 | | 5/2001 | Akram et al. | 438/109 |

FOREIGN PATENT DOCUMENTS

| | | | | |
|---|---|---|---|---|
| EP | 0 511 218 | 11/1992 | | |
| EP | 0 555 407 | 8/1993 | | |
| EP | 0 575 806 A2 | 12/1993 | | |
| JP | 54-128274 | 4/1979 | | H01L/23/30 |
| JP | 56062351 | 5/1981 | | H01L/25/04 |
| JP | 4-252049 | 9/1982 | | H01L/21/78 |
| JP | 60182731 | 9/1985 | | H01L/21/60 |
| JP | 61059862 | 3/1986 | | H01L/25/04 |
| JP | 61117858 | 6/1986 | | H01L/25/08 |
| JP | 61-214583 | 9/1986 | | H01L/33/00 |
| JP | 62119952 | 6/1987 | | H01L/25/04 |
| JP | 62-126661 | 6/1987 | | H01L/25/04 |
| JP | 62142341 | 6/1987 | | H01L/25/04 |
| JP | 63128736 | 6/1988 | | H01L/23/04 |
| JP | 63211663 | 9/1988 | | H01L/25/08 |
| JP | 63-244654 | 10/1988 | | H01L/23/28 |
| JP | 1028856 | 1/1989 | | H01L/27/00 |
| JP | 64001269 | 1/1989 | | H01L/25/04 |
| JP | 1071162 A | 3/1989 | | H01L/23/52 |
| JP | 199248 A | 4/1989 | | H01L/25/08 |
| JP | 1099248 | 4/1989 | | H01L/25/08 |
| JP | 3169062 | 7/1991 | | H01L/25/065 |
| JP | 4028260 | 1/1992 | | H01L/25/065 |
| JP | 4-56262 | 2/1992 | | H01L/25/65 |
| JP | 4056262 | 2/1992 | | H01L/25/065 |
| JP | 4096358 | 3/1992 | | H01L/25/065 |
| JP | 4116859 | 4/1992 | | H01L/25/065 |
| JP | 4-253359 | 9/1992 | | H01L/21/78 |
| JP | 4-368154 A | 12/1992 | | H01L/23/00 |
| JP | 4-368167 | 12/1992 | | H01L/25/065 |
| JP | 5013665 | 1/1993 | | H01L/25/065 |
| JP | 5-75015 | 3/1993 | | H01L/25/065 |
| JP | 5109975 | 4/1993 | | H01L/25/065 |
| JP | 5136323 | 6/1993 | | H01L/23/50 |
| JP | 5-283601 | 10/1993 | | H01L/23/52 |
| JP | 10-256470 | 9/1998 | | H01L/25/065 |
| WO | 98/25303 | 6/1998 | | H01L/23/498 |

* cited by examiner

PACKAGE FOR STACKED INTEGRATED CIRCUITS

CROSS REFERENCE TO RELATED APPLICATION

The present application is related to a commonly assigned United States patent application entitled "Package For Multiple Integrated Circuits and Method of Making," which has been assigned application Ser. No. 09/483,212, was filed on Jan. 14, 2000, and is incorporated herein by reference.

BACKGROUND

1. Field of the Invention

The present invention concerns packaging for integrated circuits. More particularly, the present invention is directed toward a high density package for at least a pair of integrated circuits.

2. Description of the Related Art

Practitioners of integrated circuit packaging strive to reduce package size and cost, while improving or maintaining package reliability, performance, and density. A common approach to achieving these objectives is to employ a ball grid array ("BGA") package. BGA packages typically include an integrated circuit mounted on an insulative substrate. Metal bond pads located proximate to peripheral sides of the integrated circuit (hereinafter "edge bond pads") are connected by bond wires to traces on an upper surface of the substrate. The traces are connected by metallized vias through the substrate to solder balls on a lower surface of the substrate. An advantage of BGA packages is that a relatively large, but not unlimited, number of solder balls can be placed on the package.

Figure 1:
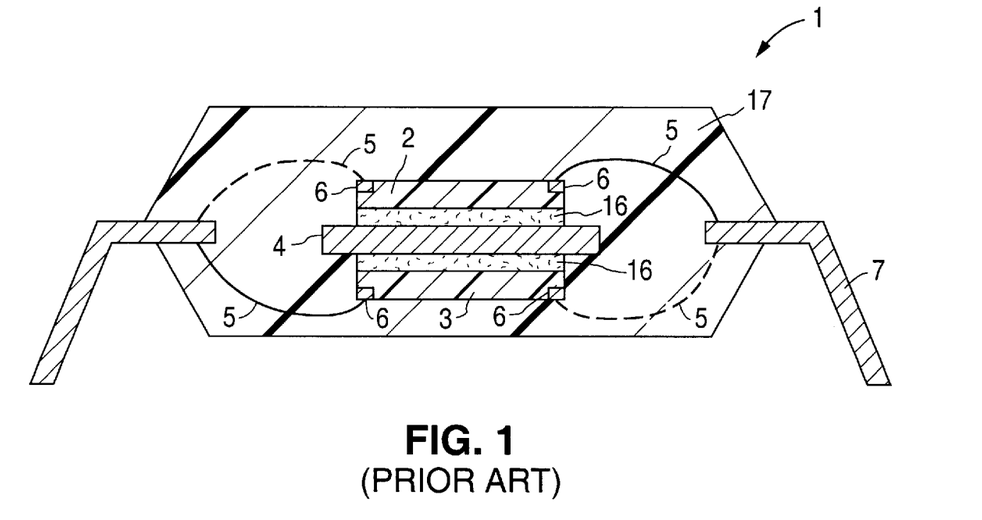
FIG. 1 is a cross-sectional side view of a conventional package 1 for integrated circuits 2 and 3.

In increase in the density of packaging has been achieved by housing a plurality of integrated circuits in a single package. FIG. 1 shows a known stacked package 1. Integrated circuits 2 and 3 each are attached to opposite surfaces of a substrate 4 by adhesive layers 16. Bond wires 5 are connected between edge bond pads 6 of integrated circuits 2 and 3 and leads 7 of a leadframe. Mold compound 17 covers integrated circuits 2 and 3, bond wires 5, and an inner end of leads 7. This package design is not compatible with integrated circuits having bond pads located at a central region of a surface of the integrated circuits, i.e., approximately half-way between opposite peripheral sides of the integrated circuit (hereinafter "center bond pads"), because the bond wire lengths become too long. In addition, package 1 requires a leadframe and is relatively large.

Figure 2:
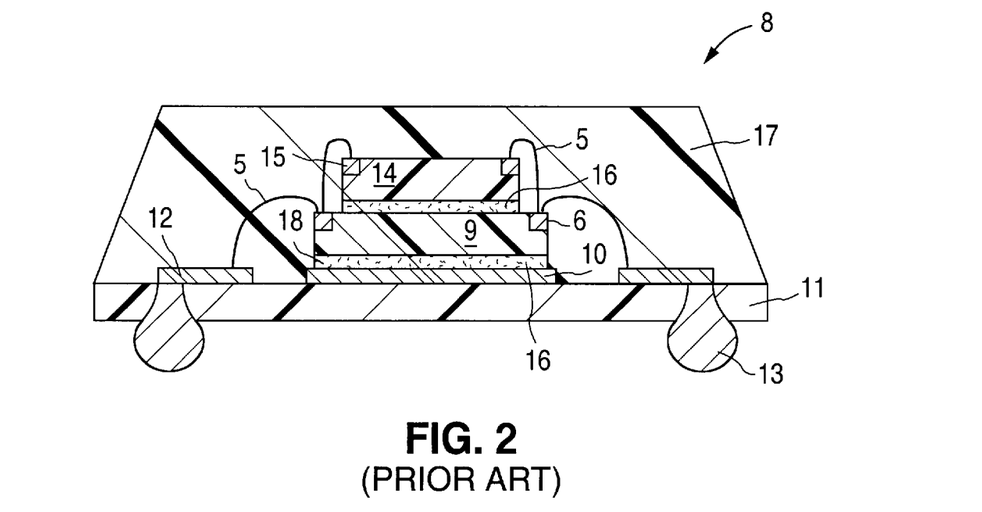
FIG. 2 is a cross-sectional side view of a conventional package 8 for integrated circuits 9 and 14.

FIG. 2 shows another known stacked package 8, which has solder balls like a BGA package. Integrated circuit 9 is attached to a metal die pad 10 on a polyimide tape substrate 11. Rows of edge bond pads 6 on integrated circuit 9 are attached by bond wires 5 to traces 12 on an upper surface of substrate 11. Traces 12 are electrically connected through substrate 11 to solder balls 13. A smaller second integrated circuit 14 is attached by adhesive 16 to integrated circuit 9. Edge bond pads 15 on integrated circuit 14 are attached by additional bond wires 5 to certain edge bond pads 6 of integrated circuit 9. In this manner, integrated circuits 9 and 14 are electrically interconnected, but integrated circuit device 14 does not have a direct bond wire connection with a trace 12. In addition, package 8 is relatively large and only accommodates integrated circuits having edge bond pads.

In view of the shortcomings of such conventional packages, what is needed is a cost effective and reliable integrated circuit package having the input and output capability of a BGA package and the density of a stacked package. Ideally, the package also would have a small footprint.

SUMMARY OF THE INVENTION

Embodiments of integrated circuit packages for housing a plurality of integrated circuits are disclosed, along with methods of making the packages. The packages have the input and output capability of BGA packages and the density of a stacked package, while having a footprint that is the same as, or nearly the same as, the footprint of an ordinary integrated circuit package for a single integrated circuit.

A first package embodiment includes a substrate having a first surface and an opposite second surface. First metallizations are on the first surface of the substrate. Three parallel slot-like apertures extend through the substrate between the first and second surfaces. The apertures include a central aperture and two peripheral apertures. A ring of a stiffening material on the second surface of the substrate supports the portion of the substrate between the two peripheral apertures and the outer sides of the substrate.

A first integrated circuit having a first surface and an opposite second is mounted the second surface of the substrate. The first surface of the first integrated circuit is attached to the second surface of the substrate so that the central bond pads are superimposed with the central aperture. A first bond wire electrically connects each central bond pad to a first metallization on the first surface of the substrate. The first bond wires extend through the central aperture. A second integrated circuit is attached to the second surface of the first integrated circuit. The second integrated circuit has a first surface with two rows of edge bond pads thereon. The first surface of the second integrated circuit is attached to the second surface of the first integrated circuit so that each row of edge bond pads superimposes a peripheral aperture. Bond wires electrically connect the edge bond pads of the second integrated circuit to first metallizations on the first surface of the substrate. A first encapsulant fills the central aperture. A second encapsulant on the second surface of the substrate covers the first and second integrated circuits and the stiffening layer, and fills the peripheral apertures. Solder balls on the first metallizations allow electrical connection of the package to a printed circuit board.

The present invention also includes methods of making such packages. An exemplary method provides a substrate having a first surface with first metallizations thereon, and an opposite second surface. One central and two peripheral apertures extend between the first and second surfaces of the substrate. A ring of a stiffening layer is attached to the second surface of the substrate. A first integrated circuit having central bond pads is mounted on the second surface of the substrate so that its central bond pads are superimposed with the central aperture. Next, a second integrated circuit is mounted on the first integrated circuit. The second integrated circuit has two rows of opposing edge bond pads. The bond pads of the first and second integrated circuits are wired to the first metallizations through the central and peripheral apertures, respectively. First encapsulant material is applied within the central aperture so as to cover the central bond pads of the first integrated circuit and their associated bond wires. Second encapsulant material is applied on the second surface of the substrate so as to cover the stacked integrated circuit devices and fill the peripheral apertures. Finally, solder balls are formed on the first metallizations so that the first and second integrated circuits may be electrically connected to a printed circuit board.

These and other embodiment of the present invention, along with many of its advantages and features, are described in more detail below and are shown in the attached figures.

BRIEF DESCRIPTION OF THE DRAWINGS

The occasional use of the same or similar reference numbers in different drawings indicates identical or similar items.

DETAILED DESCRIPTION OF THE EXEMPLARY EMBODIMENTS

Figure 3:
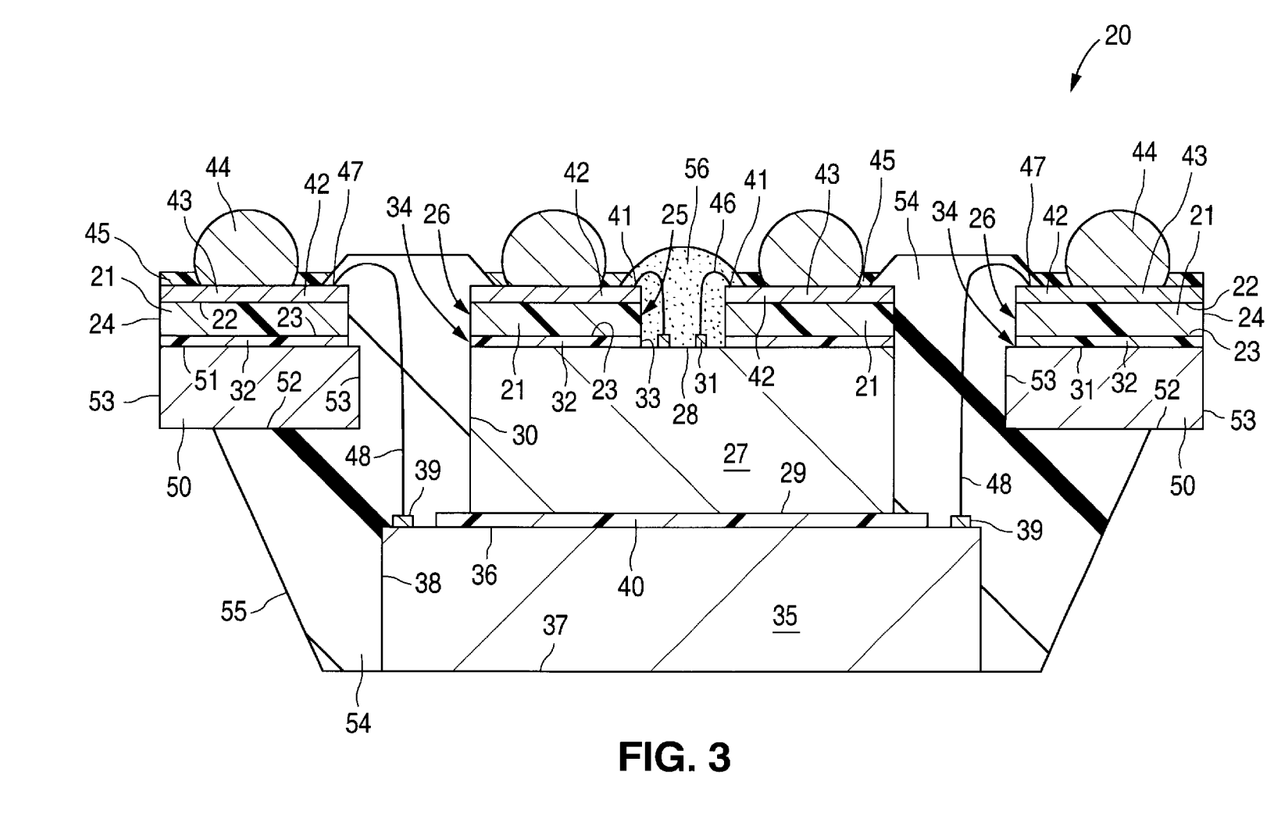
FIG. 3 is a cross-sectional side view of a package 20 for integrated circuits 27 and 35.

FIG. 3 shows a package 20 in accordance with one embodiment of the present invention. Package 20 includes a thin planar insulative substrate 21 having a planar first surface 22, an opposite planar second surface 23, orthogonal peripheral side surfaces 24, a slot-like central aperture 25 between first surface 22 and second surface 23 and parallel to side surfaces 24, and two peripheral apertures 26 between first surface 22 and second surface 23 and parallel to side surfaces 24. Peripheral apertures 26 are each position between central aperture 25 and opposing side surfaces 24 of substrate 21.

Substrate 21 may be formed from any conventional flexible or rigid insulative substrate material that is capable of withstanding chemical and thermal processes, such as plating, chemical etching, and soldering. As an example, the substrate 21 may be formed of polyimide, plastic, an epoxy laminate, or insulated metal. Alternatively, substrate 21 may be comprised of layers of such materials.

Package 20 also includes integrated circuits 27 and 35. Integrated circuit 27 includes a first surface 28 an opposite second surface 29, and peripheral side surfaces 30 between first surface 28 and second surface 29. First surface 28 includes two rows of conductive center bond pads 31 that are electrically connected to internal circuitry of integrated circuit 27. (In an alternative embodiment (not shown), there may be a single row of center bond pads 31.) Center bond pads 31 are approximately half-way between opposing side surfaces 30. A conventional double-sided adhesive film 32 having a slot-like central aperture 33 attaches first surface 28 of integrated circuit 27 to second surface 23 of substrate 21. Central apertures 25 and 33 superimpose center bond pads 31. Adhesive film 32 also includes two peripheral apertures 34 that are each parallel to central aperture 33 and are superimposed with a peripheral aperture 26 of substrate 21. Other types of adhesives may be used in place of adhesive film 32.

Similarly, integrated circuit 35 includes a first surface 36, an opposite second surface 37, and peripheral side surfaces 38 between first surface 36 and second surface 37. First surface 36 includes two rows of conductive edge bond pads 39. Each row of edge bond pads 39 is located proximate to opposing edges of first surface 36 of integrated circuit 35. Edge bond pads 39 are electrically connected to internal circuitry of integrated circuit 35. Edge bond pads 39, as well as center bond pads 31 of integrated circuit 27, typically are formed of polysilicon or metal, such as aluminum, and may be plated with other conventional metals, such as nickel and/or gold. A conventional double-sided adhesive film 40 attaches first surface 36 of integrated circuit 35 to second surface 29 of integrated circuit 27. Adhesive film 40 is located between opposing rows of edge bond pads 39 so that edge bond pads 39 may be accessed during assembly through peripheral apertures 26 and 34. Again, alternative conventional adhesives, such as epoxy, may be used instead of adhesive film 40.

In package 20, integrated circuit 27 is smaller in width than integrated circuit 35 so that edge bond pads 39 are superimposed with peripheral apertures 26 and 34 and may be accessed during assembly through peripheral apertures 26 and 34. Integrated circuits 27 and 35 may be memory (e.g., DRAM, SRAM, or flash memory), logic, or processor devices, or combinations thereof First surface 22 of substrate 21 includes a layer of electrically conductive metal features, viz., metallizations. For example, first surface 22 includes a plurality of metal bond sites 41 along opposing sides of central aperture 25. Conductive metal traces 42 on first surface 22 connect bond sites 41 to metal solder ball lands 43. Conductive solder balls 44 are attached to lands 43 and provide input and output interconnects for integrated circuit 27 of package 20. In this embodiment, all of the solder balls 44 that serve as inputs or outputs for integrated circuit 27 are between peripheral apertures 26. An insulative cover coat 45 (e.g., solder mask material) optionally covers the metal traces 42 on first surface 22 between solder balls 44 and bond sites 41.

A plurality of metal bond wires 46 are each electrically connected between a center bond pad 31 of integrated circuit 27 and a bond site 41 on first surface 22 of substrate 21. In particular, each bond wire 46 extends from a center bond pad 31 though central apertures 25 and 33 to a bond site 41 on one or the other of the opposing sides of central aperture 25 of substrate 21. In an embodiment where there are two row of center bond pads 31, each bond wire 46 may connect its respective center bond pad 31 to a bond site 41 on the side of aperture 25 closest to the respective row of center bond pads 31.

First surface 22 of substrate 21 also includes a plurality of metal bond sites 47 between each peripheral aperture 26 and the nearest side surface 24 of substrate 21. Conductive metal traces 42 on first surface 22 between each peripheral aperture 26 and the nearest side surface 24 of substrate 21 connect bond sites 47 to metal solder ball lands 43. Conductive solder balls 44 are attached to lands 43 and provide input and output interconnects for integrated circuit 35 of package 20. In this embodiment, all of the solder balls 44 that serve as inputs or outputs for integrated circuit 35 are between peripheral apertures 26 and side surfaces 24 of substrate 21, but this configuration is not required.

A plurality of metal bond wires 48 are each electrically connected between an edge bond pad 39 of integrated circuit 35 and a bond site 47 on first surface 22 of substrate 21. In particular, each bond wire 48 extends from a bond pad 39 of one of the two opposing rows of edge bond pads 39 through the superimposed peripheral apertures 26 and 34 to a bond site 47 on first surface 22.

A layer of stiffening material, denoted stiffener 50, is attached to second surface 23 of substrate 21 by adhesive film 32. Stiffener 50 is located between each peripheral aperture 26 and the adjacent side surface 24 of substrate 21.

In particular, stiffener 50 has a first surface 51 attached by adhesive film 32 to second surface 23, an opposite second surface 52, and side surfaces 53. An inner side surface 53 of stiffener 50 extends a small distance over peripheral apertures 26 and 34. An outer portion of stiffener 50, including outer side surface 53 extends beyond encapsulant 54. Stiffener 50 supports the peripheral portions of substrate 21 between peripheral apertures 26 and the adjacent side surface 24 of substrate 21. In one embodiment, stiffener 50 is a ring of metal, e.g., copper, or another stiff material that partially or fully surrounds integrated circuit 27.

The metallizations on first surface 22 of substrate 21, e.g., bond sites 41 and 47, traces 42, and lands 43 may be formed of conventional packaging metals, such as copper, copper alloy, or aluminum, and may be plated with conventional plating metals, such as gold, nickel, palladium, or combinations thereof. Bond wires 46 and 48 may be gold, gold palladium alloy, copper, aluminum, or other conventional metals.

A protective insulative encapsulant 54 covers integrated circuits 27 and 35, bond wires 46 and 48, bond sites 41 and 47, a portion of first surface 22 of substrate 21 around peripheral apertures 26, and a portion of second surface 52 of stiffener 50. Encapsulant 54 also fills peripheral apertures 26 and 34 and covers edge bond pads 39 of integrated circuit 35. In this embodiment, second surface 37 of integrated circuit 25 is exposed at an outer surface of the package, but in another embodiment encapsulant 54 covers second surface 37. Side surfaces 55 of encapsulant 54 are tapered. In a further alternative embodiment, side surface 55 of package 20 may be orthogonal and may be in the same plane as side surface 24 of substrate 21 and outer side surface 53 of stiffener 50.

In one embodiment, encapsulant 54 is a conventional molded material, e.g., an epoxy mold compound. In an alternative embodiment, encapsulant 54 may be a hardened liquid encapsulant.

A protective insulative encapsulant 56 is within central apertures 25 and 33. Encapsulant 56 covers bond wires 46, central bond pads 31, a central portion of first surface 28 of integrated circuit 27 around bond pads 31, and a portion of first surface 22 of substrate 21 around central aperture 25, including bond sites 41 and the connections between bond sites 41 and bond wires 46. Encapsulant 56 may be a molded using conventional insulative molding compounds (e.g., epoxy resin), or formed of a hardened liquid encapsulant. The height of encapsulant 56 above first surface 22 is less that the expected height of solder balls 44 after attachment to a printed circuit board.

Figure 4:
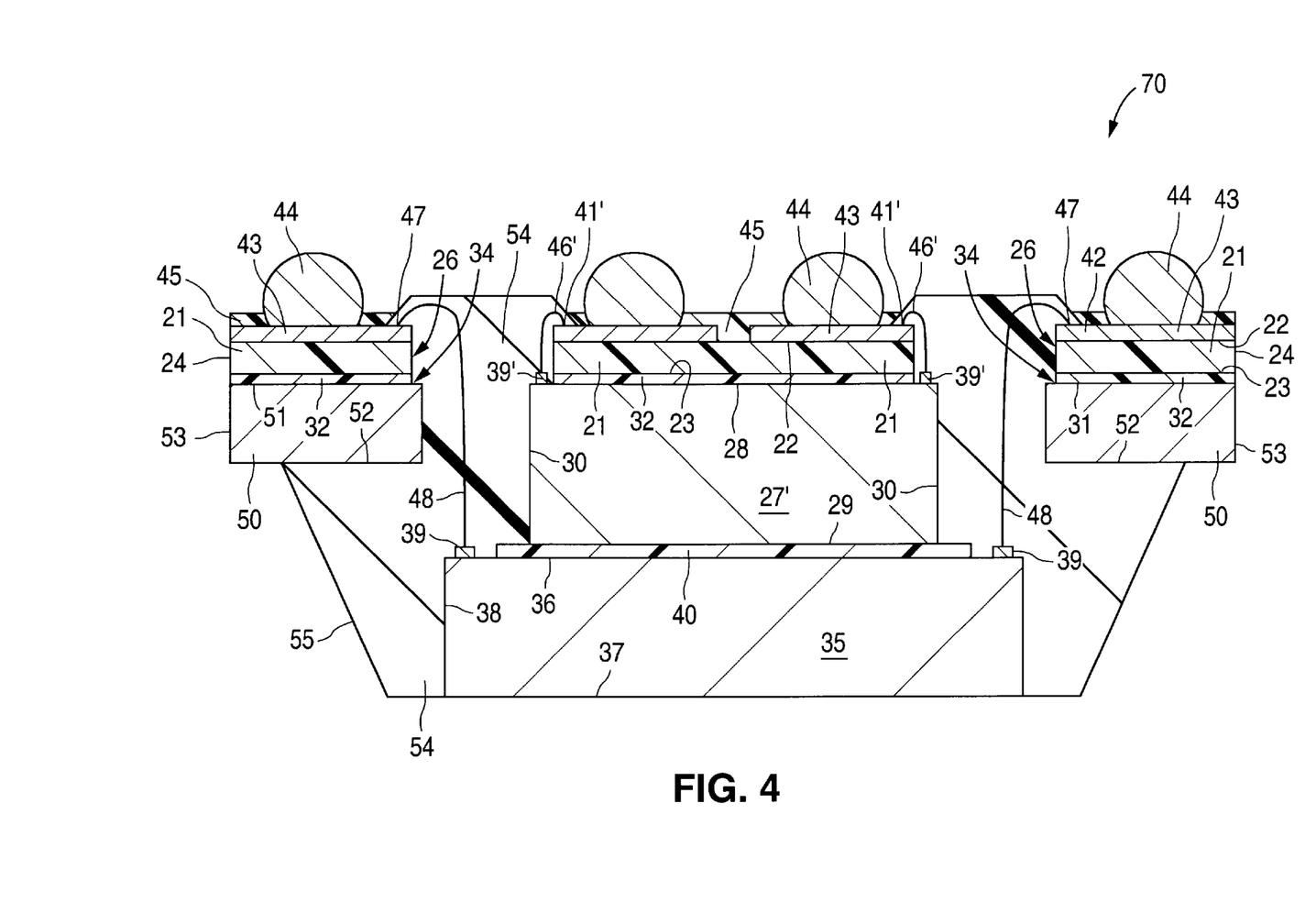
FIG. 4 is a cross-sectional side view of a package 70 for integrated circuits 27' and 35.

FIG. 4 is an alternative embodiment of a package 70 within the present invention. Package 70 is similar in large part to package 20 of FIG. 3. Accordingly, the discussion below shall focus on differences between the packages to avoid redundancy.

In FIG. 4, package 70 includes an integrated circuit 27' that includes all of the features of integrated circuit 27 of FIG. 3, except that instead of having central bond pads 31 like integrated circuit 27, integrated circuit 27' has two parallel rows of edge bond pads 39' each adjacent to an opposing side 30 of integrated circuit 27'. In this manner, integrated circuit 27' is similar to integrated circuit 35 of FIGS. 3 and 4. Accordingly, package 70 also lacks central apertures 25 and 33 and encapsulant 56 of package 20 of FIG. 3. Moreover, bond sites 41' on first surface 22 of substrate 21 are located along a side of peripheral apertures 34 opposite bond sites 47.

Relatively short bond wires 46' of package 70 of FIG. 4 electrically connect edge bond pads 39' of integrated circuit 27' to bond sites 41' on first surface 22 in a fan in type arrangement. Bond wires 48 electrically connect edge bond pads 39 of integrated circuit 35 to bond sites 47 in a fan out type arrangement. Accordingly, the metallizations and solder balls 44 that provide the inputs and outputs of integrated circuit 27' are on a central portion of first surface 22 between the peripheral apertures 26 of substrate 21, and the metallizations and solder balls 44 that provide the inputs and outputs of integrated circuit 35 are on first surface 22 between each peripheral aperture 26 and the immediately adjacent side 24 of substrate 21. Bond wires 46', bond sites 41' and the portions of first surface 22 of substrate 21 around peripheral apertures 34 of package 70 are covered by encapsulant 54. In an alternative embodiment, if desired some of bond wires 48 could connect to respective bond sites 41' as well.

FIGS. 5A–5G provide cross sectional views of stages in an exemplary method of assembly of package 20 of FIG. 3. In this exemplary embodiment, package 20 is assembled in a batch process that assembles a plurality of packages 20 in parallel. Artisans will appreciate that package 70 of FIG. 4 may assembled in a substantially similar fashion.

Figure 5A:
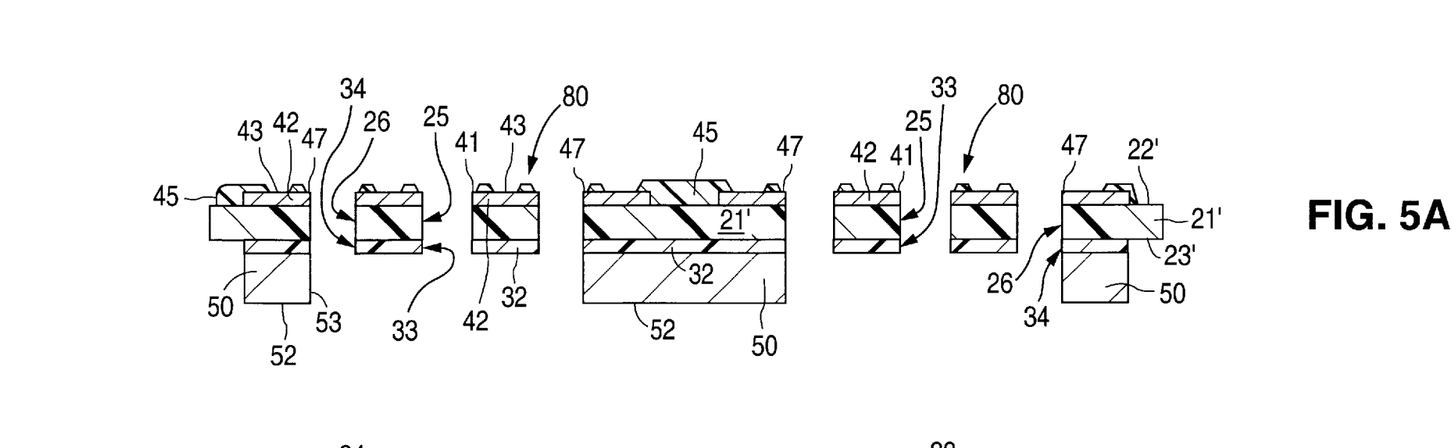
FIGS. 5A–5G are cross-sectional side views of stages in an exemplary method of assembling package 20 of FIG. 3.

Referring to FIG. 5A, a thin insulative substrate strip 21' having a layer of patterned metallizations thereon is provided. Substrate strip 21' has a first surface 22' and opposite second surface 23', and a plurality of identical package sites 80 in a matrix arrangement thereon. Two package sites 80 are shown in this cross-section, but the number of package sites 80 may vary (e.g., eight, twelve, sixteen, etc.) A package 20 is assembled at each package site 80. Essentially, substrate strip 21' is a plurality of joined substrates 21 of FIG. 3. Each package site 80 includes (see FIGS. 3 and 5A) a first surface 22, second surface 23, central aperture 25, two peripheral apertures 26, bond sites 41 and 47, lands 43, traces 42, and an optional cover coat 45 having openings through which bond sites 41 and 47 and lands 43 are exposed. The width of central aperture 25 and peripheral apertures 26 may vary, provided that they are wide enough to allow access for a subsequent wire bonding step.

In addition, a sheet of adhesive film 32 is attached to second surface 23' so as to cover each package site 80 of substrate strip 21'. Adhesive film 32 may be attached in the manner described in co-pending U.S. patent application Ser. No. 09/449,070, entitled "Methods Of Attaching A Sheet Of An Adhesive Film To A Substrate In The Course Of Making Integrated Circuit Packages," which was filed on Nov. 23, 1999 and is incorporated herein by reference. Consistent with discussion therein, a relatively large single sheet of an adhesive film 32 is placed over all of the package sites 80 and then cured by the application of pressure and/or heat. The pressure and/or heat are applied by rollers. Subsequently, apertures 25, 26, 33, and 34 at each package site 80 of substrate strip 21' would be formed by a punch or equivalent. Alternatively, discrete adhesive films 32 could be attached to substrate 21' at each package site 80, or an adhesive such as epoxy could be used instead of an adhesive film.

In addition, a layer of stiffening material, denoted stiffener 50 in FIGS. 3 and 5A, has been placed on and attached to adhesive film 32 at each package site 80 of substrate strip 21' outside of the respective peripheral apertures 26. Stiffener 50 is thicker than substrate 21', although the thickness necessary for stiffener 50 would depend on the desired degree of stiffness required and the material chosen for stiffener 50. In one embodiment, a relatively large sheet of copper or another metal is stamped or etched so as to have rectangular apertures at locations corresponding to the locations of package sites 80 on substrate sheet 21'. Each aperture has a width that is slightly less than, or equal to, the distance between peripheral apertures 34 of each package site. The patterned sheet of stiffening material is then attached to adhesive film 32 using pressure and/or heat. The integrated circuits ultimately are mounted within the apertures in the layer of stiffener 50.

Substrate strip 21' may be formed of any conventional insulative material, including an polyimide film, an epoxy laminate, or insulated metal, or combinations of such layers. The metallizations on first surface 22' of substrate strip 21' may be formed by conventional methods.

Figure 5B:
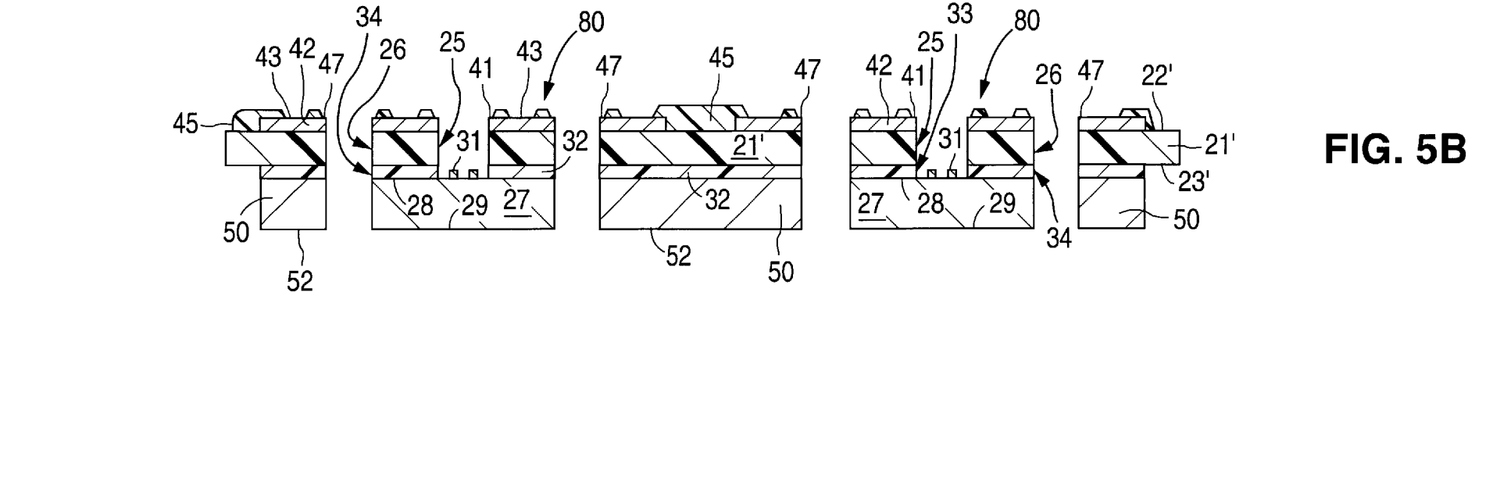

Referring to FIG. 5B, a first surface 28 of an integrated circuit 27 is placed on the adhesive film 32 at each package site 80. Integrated circuit 27 may be a DRAM device or some other device. After curing, adhesive film 32 attaches an integrated circuit 27 to second surface 23' of substrate strip 21' at each package site 80. Second surface 29 of integrated circuit 27 may be polished or otherwise ground to reduce the height of integrated circuit 27. Integrated circuit 27 may be placed on adhesive film 32 and cured in a conventional manner, or in the manner described in co-pending U.S. application Ser. No. 09/412,889, entitled "Method Of Making An Integrated Circuit Package Using A Batch Step For Curing A Die Attachment Film And A Tool System For Performing The Method," which was filed on Oct. 5, 1999 and is incorporated herein by reference.

Figure 5C:
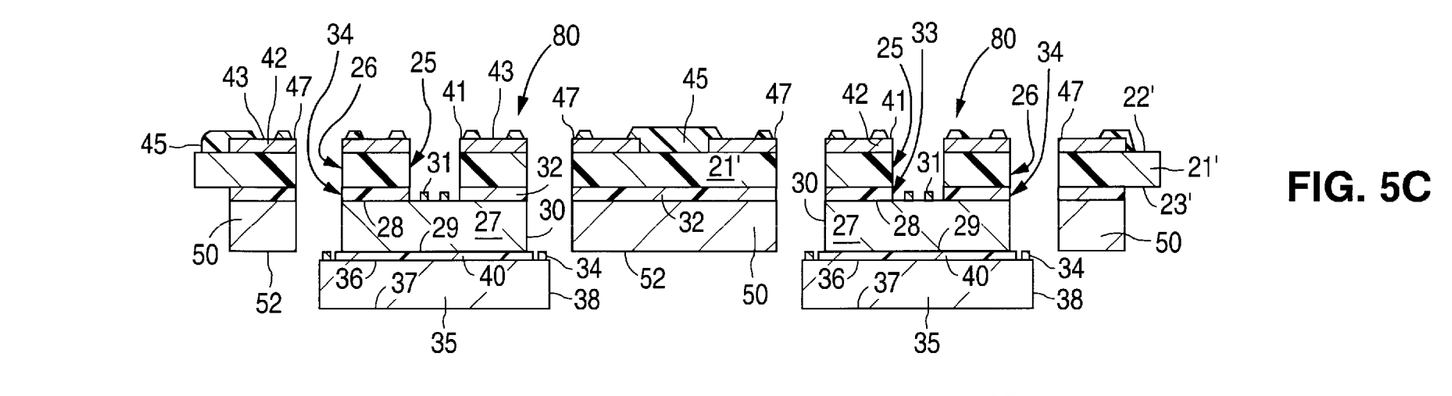

Referring FIG. 5C, integrated circuit 35 is attached to second surface 29 of integrated circuit 27 using an adhesive film 40. Integrated circuit 35 may be a DRAM, SRAM, or flash memory device, a logic or processor device, or some other device. In one embodiment, a sheet of adhesive film is placed onto the backside of a wafer containing integrated circuit 27 and is cured before integrated circuit 27 is sawed from the wafer. The sawing step forms individual integrated circuits 27 each having an adhesive film 40 on its second surface 29. After the sawing step, each integrated circuit 27 of the wafer is placed onto adhesive film 32 on second surface 23' of substrate 21' so that integrated circuit 35 may be attached to integrated circuit 27 by adhesive film 40. Alternatively, an adhesive such as epoxy may be used instead of adhesive film 40.

Second surface 37 of integrated circuit 35 may be polished or ground to reduce the height of integrated circuit 35. In addition, the edge bond pads 34 on integrated circuit 35 may have been relocated (e.g., changed from being central bond pads to edge bond pads). Central bond pads 31 of integrated circuit 27 also may have been relocated.

In the above described process, adhesive films 32 and 40 are cured in separate curing steps. Alternatively, integrated circuits 27 and 35 may be secured using a single curing step.

Figure 5D:
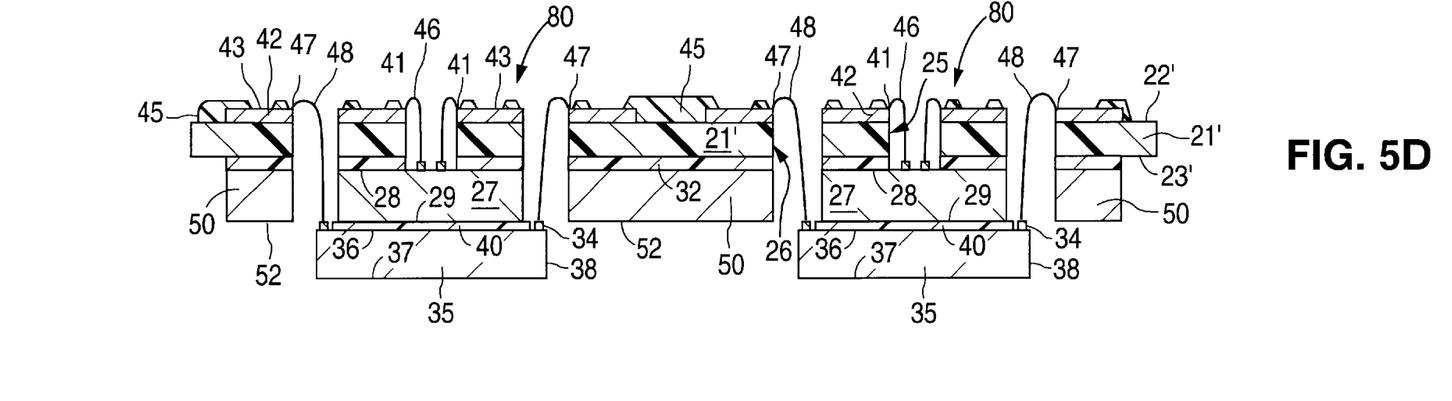

Referring to FIG. 5D, bond wires 46 are connected at each package site 80 between respective center bond pads 31 of the respective integrated circuit 27 and the associated bond sites 41 through the respective central aperture 25. In addition, bond wires 48 are connected at each package site 80 between edge bond pads 39 and the associated bond sites 47 through the respective peripheral apertures 26. Conventional bond wires and conventional bond wiring techniques may be used.

Figure 5E:
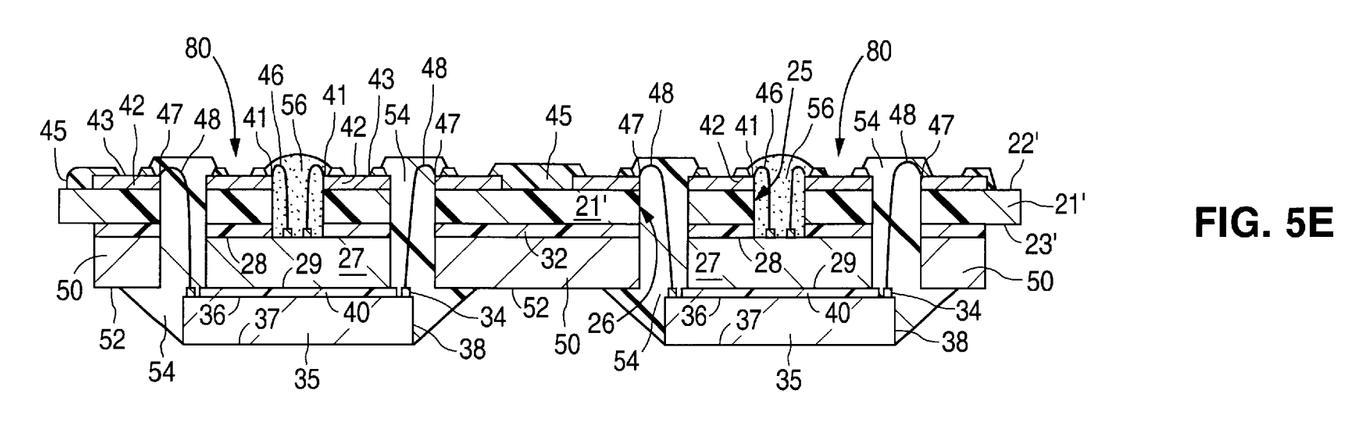

Referring to FIG. 5E, encapsulant 56 is applied on first surface 22' of substrate strip 21' and within and around central apertures 25 and 33 of each package site 80 so as to cover the center bond pads 31 and the surrounding portions of first surface 28 of integrated circuit 27, bond wires 46, and bond sites 41. Encapsulant 56 may be a molded using conventional insulative molding compounds (e.g., epoxy mold compound) and molding techniques (e.g., transfer or injection molding). Liquid encapsulant material also may be used. In addition, encapsulant 54 is applied onto first surface 22' and second surface 23' of substrate 21' at each package site 80 so as to form an insulative and protective covering over the respective integrated circuits 27 and 35, bond wires 48, edge bond pads 39, bond sites 47, and an inner portion of stiffener 50. Encapsulant 54 fills peripheral apertures 26 and 34 and covers a portion of first surface 22' around peripheral apertures 26 at each package site 80. In this embodiment, a discrete unit of encapsulant 54 having tapered side surfaces 55 is formed at each package site 80 using a mold having a cavity for each package site. Conventional insulative molding compounds and techniques (e.g., injection or transfer molding) may be used. In an alternative embodiment, a single block of encapsulant is molded or formed using liquid encapsulation techniques over all of the package sites 80 of substrate strip 21'.

In one molding embodiment, encapsulants 54 and 56 are simultaneously formed in a single molding operation. Alternatively, encapsulants 54 and 56 may be molded in separate steps.

Figure 5F:
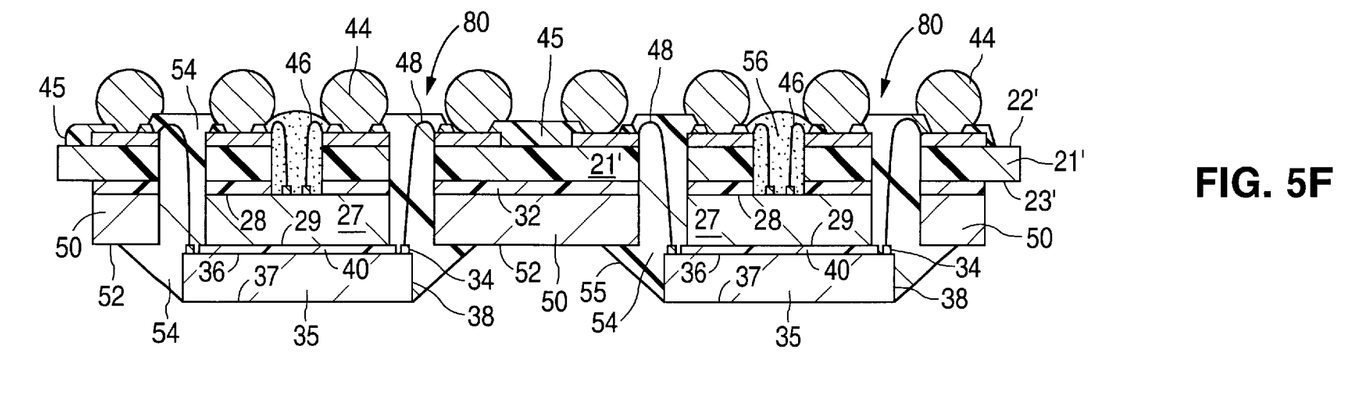

Referring to FIG. 5F, conventional metal solder balls 44 are attached to lands 43 at each package site 80 of substrate strip 21'. Conventional techniques may be used.

Figure 5G:
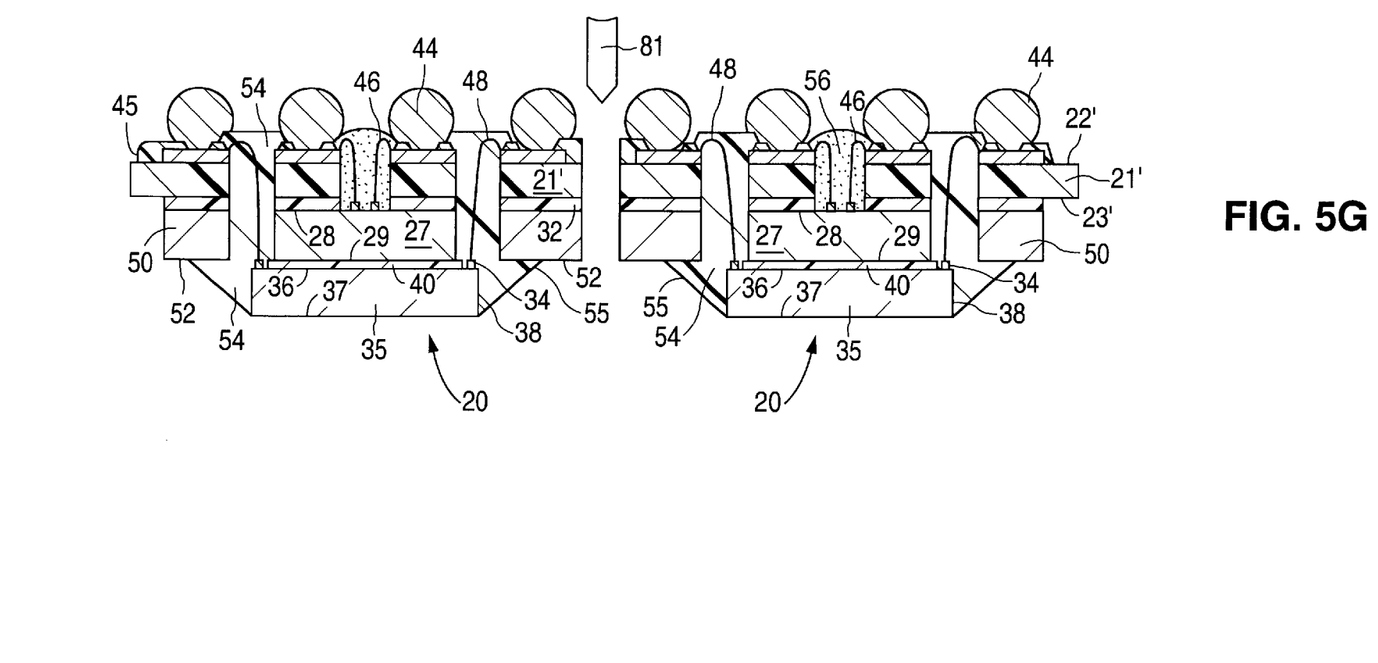

Finally, referring to FIG. 5G, individual packages 20 are separated from the encapsulated substrate strip 21'. Individual packages 20 may be singulated by cutting through substrate 21', stiffener layer 50', and adhesive film layer 32' with a saw 81. Depending on the method of encapsulation used to form encapsulant 54, it also may be necessary to cut through the encapsulant. Second surfaces 37 of integrated circuits 35 may be placed on a sheet of tape to secure substrate strip 21' during the sawing step.

The embodiments described herein are merely examples of the present invention. Artisans will appreciate that variations are possible within the scope of the claims.

We claim:

1. An integrated circuit package comprising:
   a substrate having a first surface with first metallizations thereon, an opposite second surface, and a plurality of apertures between the first and second surfaces;
   a first integrated circuit having a first surface with first bond pads thereon and an opposite second surface, wherein the first surface of the first integrated circuit is on the second surface of the substrate, the first bond pads are superimposed with at least one of the apertures, and each first bond pad is electrically connected by a first bond wire extending through the superimposing aperture to a first metallization; and
   a second integrated circuit having a first surface with conductive second bond pads thereon, wherein the first surface of the second integrated circuit is on the second surface of the first integrated circuit, the second bond pads are superimposed with at least one of the apertures, and each second bond pad is electrically connected by a second bond wire extending through the superimposing aperture to a first metallization.

2. The package of claim 1, further comprising a stiff layer on the second surface of the substrate, wherein said stiff layer is laterally between said first integrated circuit and a peripheral side of the package.

3. The package of claim 2, wherein said stiff layer surrounds said first integrated circuit.

4. The package of claim 1, further comprising solder balls electrically connected to said first metallizations.

5. The package of claim 1, wherein the first bond pads are center bond pads, and the second bond pads are edge bond pads.

6. The package of claims 5, wherein the substrate comprises a first aperture that superimposes said first bond pads, and two second apertures;
wherein each second aperture is parallel to and on opposite sides of said first aperture, and each second aperture superimposes at least one row of said second bond pads.

7. The package of claim 6, wherein a first encapsulant fills said first aperture, and a second encapsulant fills said second apertures.

8. The package of claim 1, wherein the first and second bond pads are edge bond pads.

9. The package of claim 8, wherein at least one row of said first bond pads and one row of said second bond pads are superimposed by a first of said apertures, and an opposite row of said first bond pads and an opposite row of said second bond pads are superimposed by a second of said apertures.

10. The package of claim 9, wherein a first encapsulant covers said first and second bond wires.

11. The package of claim 1, wherein said second integrated circuit comprises a second surface that is exposed at an exterior surface of said package.

12. An integrated circuit chip package comprising:
a substrate having opposing first and second surfaces, at least one aperture between the first and second surfaces, and metallizations only on the first surface of the substrate; and
first and second integrated circuit chips stacked one on the other and mounted on the second surface of the substrate, wherein the first and second integrated circuit chips each include a plurality of bond pads, with each of said bond pads facing a respective one of the apertures and being electrically connected through the faced aperture to a respective one of the metallizations on the first surface of the substrate.

13. The integrated circuit chip package of claim 12, wherein a unitary hardened encapsulant material fills each said aperture and covers the first and second integrated circuit chips.

14. The integrated circuit chip package of claim 12, wherein a first encapsulant material covers the bond pads of the first integrated circuit chip, and a second encapsulant covers the bond pads of the second integrated circuit chip.

15. The integrated circuit chip package of claim 12, further comprising solder balls each fused to respective ones of the metallizations of the first surface of the substrate.

16. The integrated circuit chip package of claim 12, further comprising a stiff ring on the second surface of the substrate around the first integrated circuit chip, and an encapsulant material covering said stiff ring and the first and second semiconductor chips.

17. The integrated circuit chip package of claim 12, wherein at least some of the bond pads of the first and second integrated circuit chips face a common one of the apertures.

18. The integrated circuit chip package of claim 12, wherein the bond pads of the first integrated circuit chip are located only at a central portion of a first surface of the first integrated circuit chip, the bond pads of the second integrated circuit chip are located only adjacent a periphery of a first surface of the second integrated circuit chip, and the first surface of the first and second integrated circuit chips faces the second surface of the substrate.

19. The integrated circuit chip package of claim 12, wherein the bond pads of the first integrated circuit chip are located only adjacent a periphery of a first surface of the first integrated circuit chip, the bond pads of the second integrated circuit chip are located only adjacent a periphery of a first surface of the second integrated circuit chip, and the first surface of the first and second integrated circuit chips faces the second surface of the substrate.

20. An integrated circuit package comprising:
a substrate having a first surface with metallizations thereon and an opposite second surface;
a first integrated circuit chip mounted on the second surface of the substrate and comprising a first surface and an opposite second surface, wherein the first surface of the first integrated circuit chip includes a plurality of bond pads;
a second integrated circuit chip mounted on the second surface of the first semiconductor chip and comprising a first surface having a plurality of bond pads thereon, wherein the first surface of the second integrated circuit chip faces the second surface of the first integrated circuit chip;
a plurality of means for electrically connecting the respective bond pads of the first and second integrated circuits to respective ones of the metallizations of the first surface of the substrate through an aperture through the substrate;
a hardened encapsulant material covering each said bond pad and each said means.

21. The integrated circuit chip package of claim 20, further comprising first and second bodies of the hardened encapsulant material, wherein the first body of hardened encapsulant material covers the bond pads of the first integrated circuit chip and the second encapsulant material covers the bond pads of the second integrated circuit chip.

22. The integrated circuit chip package of claim 20, wherein all said bond pads and said means are covered by a unitary body of the encapsulant material.

23. The integrated circuit chip package of claim 20, further comprising an encapsulated means mounted on the second surface of the substrate for stiffening the substrate.

* * * * *